(12) United States Patent
Khater (10) Patent No.: US 6,972,443 B2
(45) Date of Patent: Dec. 6, 2005

(54) STRUCTURE AND METHOD OF FORMING A BIPOLAR TRANSISTOR HAVING A SELF-ALIGNED RAISED EXTRINSIC BASE USING LINK-UP REGION FORMED FROM AN OPENING THEREIN

(75) Inventor: Marwan H. Khater, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,222

(22) Filed: Apr. 22, 2004

(65) Prior Publication Data

US 2005/0236647 A1 Oct. 27, 2005

(51) Int. Cl.[7] .................. H01L 31/072; H01L 31/109
(52) U.S. Cl. .................. 257/197; 257/198; 257/200; 438/235; 438/309; 438/312
(58) Field of Search .............................. 257/197, 198, 257/200, E29.174; 438/235, 309, 312

(56) References Cited

U.S. PATENT DOCUMENTS

| 5,128,271 | A | 7/1992 | Bronner et al. |
|---|---|---|---|
| 5,494,836 | A | 2/1996 | Imai |
| 5,506,427 | A | 4/1996 | Imai |
| 5,962,880 | A | 10/1999 | Oda et al. |
| 6,346,453 | B1 | 2/2002 | Kovacic et al. |
| 6,429,085 | B1 | 8/2002 | Pinter |
| 6,437,376 | B1 | 8/2002 | Ozkan |
| 6,472,262 | B2 | 10/2002 | Chantre et al. |
| 6,501,153 | B2 * | 12/2002 | Oue et al. .................. 257/625 |
| 6,559,020 | B1 | 5/2003 | Salmi |

\* cited by examiner

*Primary Examiner*—Jerome Jackson
*Assistant Examiner*—Joseph Nguyen
(74) *Attorney, Agent, or Firm*—Daryl K. Neff; H. Daniel Schnurmann (57) ABSTRACT

A bipolar transistor is provided which includes a collector region, an intrinsic base layer including a single-crystal semiconductor overlying the collector region, and an emitter disposed within a first opening overlying the intrinsic base layer. The bipolar transistor includes a raised extrinsic base, which in turn includes a raised extrinsic base layer and a link-up region which electrically connects the raised extrinsic base layer to the intrinsic base layer. The link-up region also self-aligns the raised extrinsic base to the emitter. The link-up region is disposed in a second opening separate from the first opening and in an undercut region extending from the second opening below the raised extrinsic base layer.

9 Claims, 12 Drawing Sheets

STRUCTURE AND METHOD OF FORMING A BIPOLAR TRANSISTOR HAVING A SELF-ALIGNED RAISED EXTRINSIC BASE USING LINK-UP REGION FORMED FROM AN OPENING THEREIN

BACKGROUND OF INVENTION

High performance circuits, especially those used for radio frequency chips, favor the use of heterojunction bipolar transistors (HBTs) to provide high maximum oscillation frequency $f_{MAX}$ and high transit frequency $f_T$, also referred to as "cutoff frequency". HBTs have a structure in which the base of the transistor includes a relatively thin layer of single-crystal semiconductor alloy material. As an example, an HBT fabricated on a substrate of single-crystal silicon can have a single-crystal base formed of silicon germanium (SiGe) having substantial germanium content and profile to improve high speed performance. Such HBT is commonly referred to as a SiGe HBT.

The juxtaposition of alloy semiconductor materials within a single semiconductor crystal is called a "heterojunction." The heterojunction results in an increase in current gain. This increase in gain allows a significant increase in base doping, and corresponding decrease in base resistance, which would otherwise result in a decrease in current gain. Further, by varying the composition of the semiconductor alloy in the base as a function of position, a significant quasi-static field may be created that enhances the velocity of charge carriers in the base. Increased velocity, in turn, enables higher gain and cutoff frequency to be achieved than in transistors having a uniform semiconductor alloy composition throughout.

To increase the performance of an HBT, it is desirable to increase both the transit frequency $f_T$ and the maximum oscillation frequency $f_{MAX}$. $F_{MAX}$ is a function of $f_T$ and of parasitic resistances and parasitic capacitances (collectively referred to herein as "parasitics") between elements of the transistor according to the formula $f_{MAX} = (f_T/8\pi^* C_{cb}^* R_b)^{1/2}$. The most significant parasitics are the collector-base capacitance $C_{cb}$ and the base resistance $R_b$ because their values are typically larger than the other parasitics, making their effects on $f_{MAX}$ more pronounced. Thus, it is desirable to provide an HBT structure and method by which $C_{cb}$ and $R_b$ are significantly reduced.

Figure 1:
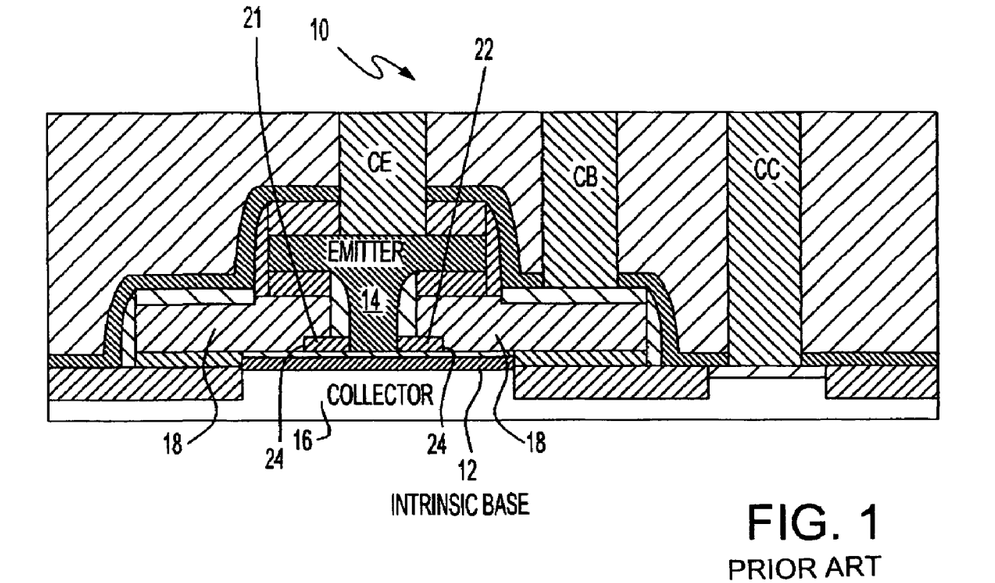
FIG. 1 illustrates a non-self-aligned bipolar transistor according to the prior art, in which the raised extrinsic base includes polysilicon and is not self-aligned to the emitter.

As provided by the prior art, differences exist among SiGe HBTs which allow them to achieve higher performance, or to be more easily fabricated. A cross-sectional view of one such prior art SiGe HBT 10 is illustrated in FIG. 1. Such non self-aligned HBT 10 can be fabricated relatively easily, but other designs provide better performance. As depicted in FIG. 1, the HBT 10 includes an intrinsic base layer 12, which is disposed in vertical relation between the emitter 14 and the collector 16. The intrinsic base layer 12 includes a single-crystal layer of silicon-germanium (SiGe). The intrinsic base layer 12 forms a heterojunction with the collector 16. While the bipolar transistor illustrated in FIG. 1 is described as an HBT having an intrinsic base layer including a layer of SiGe, the intrinsic base layer can be single-crystal silicon, in which case the transistor is not a "heterojunction" bipolar transistor, but simply a bipolar transistor.

A raised extrinsic base 18 is disposed over the intrinsic base layer 12 as an annular structure surrounding the emitter 14. The purpose of the raised extrinsic base 18 is to inject a base current into the intrinsic base layer 12. For high performance, the interface 24 between the raised extrinsic base 18 and the intrinsic base layer is close to the junction between the emitter 14 and the intrinsic base layer 12. By making this distance small, the resistance across the intrinsic base layer 12 between the interface 24 and the emitter 14 is decreased, thereby reducing the base resistance $R_b$ (hence RC delay) of the HBT 10. It is desirable that the interface 24 to the raised extrinsic base be self-aligned to the edge of the emitter 14. Such self-alignment would exist if the raised extrinsic base were spaced from the emitter 14 only by the width of one or more dielectric spacers formed on a sidewall of the raised extrinsic base 18.

However, in the HBT 10 shown in FIG. 1, the interface 24 is not self-aligned to the emitter 14, and the distance separating them is not as small or as symmetric as desirable. A dielectric etch stop layer, portions 21, 22 of which are visible in the view of FIG. 1, is disposed as an annular structure surrounding the emitter 14. Portions 21, 22 of the etch stop layer separate the raised extrinsic base 18 from the intrinsic base layer 12 on different sides of the emitter 14, making the two structures not self-aligned. Moreover, as shown in FIG. 1, because of imperfect alignment between lithography steps used to define the edges of portions 21 and 22 and those used to define the emitter opening, the lengths of portions 21 and 22 can become non-symmetric about the emitter opening, causing performance to vary.

The etch stop layer functions as a sacrificial etch stop layer during fabrication. The formation of the etch stop layer and its use are as follows. After forming the intrinsic base layer 12 by epitaxial growth onto the underlying substrate 11, a layer of silicon dioxide is deposited as the etch stop layer and is then photolithographically patterned to expose the intrinsic base layer 12. This photolithographic patterning defines the locations of interface 24 at the edges of etch stop layer portions 21, 22, which will be disposed thereafter to the left and the right of the emitter 14. A layer of polysilicon is then deposited to a desired thickness, from which layer the extrinsic base 18 will be formed.

Thereafter, an opening is formed in the polysilicon by anisotropically etching the polysilicon layer (as by a reactive ion etch) selectively to silicon dioxide, such etch stopping on the etch stop layer. After forming a spacer in the opening, the etch stop layer is then wet etched within the opening to expose intrinsic base layer 12. A problem of the non-self-aligned structure of HBT 10 is high base resistance $R_b$. Resistance is a function of the distance of a conductive path, divided by the cross-sectional area of the path. As the intrinsic base layer 12 is a relatively thin layer, significant resistance can be encountered by current traversing the distance from the extrinsic base under etch stop layer portions 21, 22 to the area of the intrinsic base layer 12 under the emitter 14, such resistance limiting the high speed performance of the transistor.

Figure 2:
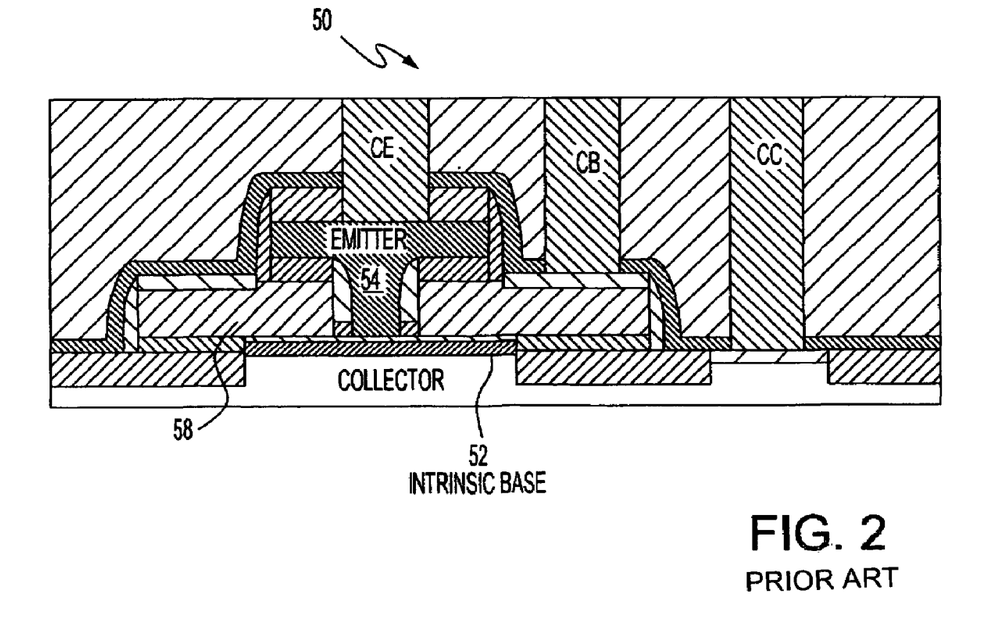
FIG. 2 illustrates a self-aligned bipolar transistor according to the prior art, in which the raised extrinsic base includes polysilicon and is self-aligned to the emitter.

FIG. 2 is a cross-sectional view illustrating another HBT 50 according to the prior art. Like HBT 10, HBT 50 includes an intrinsic base 52 having a layer of silicon or silicon germanium and an extrinsic base 58 consisting of polysilicon in contact with the single-crystal intrinsic base 52. However, unlike HBT 10, HBT 50 does not include etch stop layer portions 21, 22, but rather, the raised extrinsic base 58 is self-aligned to the emitter 54, the extrinsic base 58 being spaced from the emitter 54 by a dielectric spacer. Self-aligned HBT structures such as HBT 50 have demonstrated high $f_T$ and $f_{MAX}$ as reported in Jagannathan, et al., "Self-aligned SiGe NPN Transistors with 285 GHz $f_{MAX}$ and 207 GHz $f_T$ in a Manufacturable Technology," IEEE Electron Device letters 23, 258 (2002) and J. S. Rieh, et al., "SiGe HBTs with Cut-off Frequency of 350 GHz," International Electron Device Meeting Technical Digest, 771 (2002). In such self-aligned HBT structures, the emitter 54 is self-aligned to the raised extrinsic base 58.

Several methods are provided by art which is background to the present invention for fabricating HBTs 50 like that shown in FIG. 2. According to one approach, chemical mechanical polishing (CMP) is used to planarize the extrinsic base polysilicon over a pre-defined sacrificial emitter pedestal, as described in U.S. Pat. Nos. 5,128,271 and 6,346,453. A drawback of this method is that the thickness of the extrinsic base, hence the base resistance $R_b$, can vary significantly between small and large devices, as well as, between low and high density areas of devices due to dishing of the polysilicon during CMP.

In another approach, described in U.S. Pat. Nos. 5,494,836; 5,506,427; and 5,962,880, the intrinsic base is grown using selective epitaxy inside an emitter opening and under an overhanging polysilicon layer of the extrinsic base. In this approach, self-alignment of the emitter to the extrinsic base is achieved by the epitaxially grown material under the overhang. However, with this approach, special crystal growth techniques are required to ensure good, low-resistance contact between the intrinsic base and the extrinsic base.

In another approach, described in U.S. Pat. Nos. 6,429,085; 6,437,376; 6,472,262; and 6,559,020, epitaxial growth is used to link the extrinsic base to an intrinsic base that is grown non-selectively. A major drawback of this method is that the link-up between the extrinsic base and the intrinsic base is done inside the emitter opening. As a result, processing which provides good control over the formation of the link-up layer can nevertheless adversely affect the final emitter dimension and the integrity of the emitter-base interface, i.e. junction. Alternatively, processing which provides good control over the final emitter dimension and emitter-base junction may fail to produce a link-up layer having sufficient quality. Stated another way, the self-alignment of the extrinsic base to the emitter and the final emitter dimension are closely coupled in this approach, and their processing quality is traded off in relation to the quality of the link-up process.

It would be desirable to provide a self-aligned bipolar transistor such as an HBT and method for making such bipolar transistor that is more easily performed and kept within tolerances, and which, therefore, overcomes the challenges to the performance of the prior art bipolar transistor and prior art fabrication methods.

It would further be desirable to increase the maximum oscillation frequency $f_{MAX}$ through change in the horizontal profiles of the collector, base, emitter and/or the junctions between them.

SUMMARY OF INVENTION

According to an aspect of the invention, a bipolar transistor is provided which includes a collector region, an intrinsic base layer including a single-crystal semiconductor overlying the collector region, and an emitter disposed within a first opening overlying the intrinsic base layer. The bipolar transistor includes a raised extrinsic base, which in turn includes a raised extrinsic base layer and a link-up region which electrically connects the raised extrinsic base layer to the intrinsic base layer. The link-up region also self-aligns the raised extrinsic base to the emitter. The link-up region is disposed in a second opening separate from the first opening and in an undercut region extending from the second opening below the raised extrinsic base layer.

According to another aspect of the invention, a method is provided for making a bipolar transistor. According to such method, a structure is formed including an intrinsic base overlying a collector region, the intrinsic base layer consisting essentially of a single-crystal semiconductor. A dielectric layer is formed over the intrinsic base layer and a raised extrinsic base layer is formed over the dielectric layer. A sacrificial region is formed in a first opening in the raised extrinsic base layer and the dielectric layer. A second opening is formed in the raised extrinsic base layer, the second opening separate from the first opening. The dielectric layer is etched from within the second opening to form an undercut region that underlies the raised extrinsic base layer. A link-up region is formed in the second opening and the undercut region, the link-up region electrically connecting the raised extrinsic base layer to the intrinsic base layer. Thereafter, the sacrificial region is removed from the first opening and an emitter is formed in the first opening, such that the link-up region and the raised extrinsic base layer are self-aligned to the emitter.

DETAILED DESCRIPTION

Figure 3:
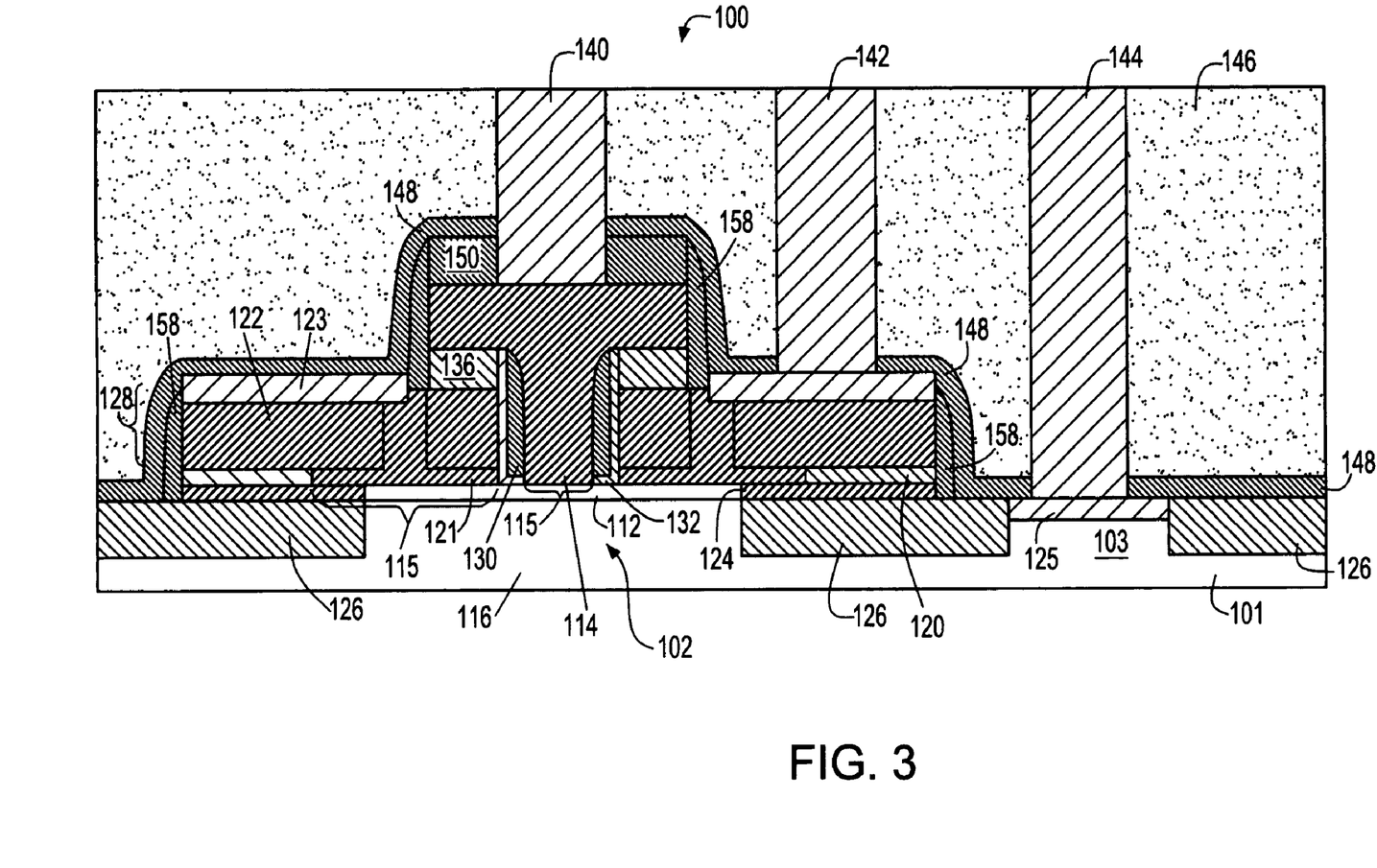
FIG. 3 illustrates the structure of a bipolar transistor according to an embodiment of the invention.

FIG. 3 is a cross-sectional view illustrating a bipolar transistor 100 according to an embodiment of the invention. As shown in FIG. 3, transistor 100 is desirably fabricated on a substrate 101, e.g. wafer, of single-crystal silicon. The transistor 100 includes a collector 116, an intrinsic base 112 including a layer of single-crystal semi-conductor of silicon or alloy such as silicon germanium (SiGe) overlying the collector 116 region. An emitter 114 has at least a portion disposed within a first opening 115 overlying the intrinsic base 112.

A raised extrinsic base 128 for the transistor 100 is also provided, which includes a raised extrinsic base layer 122 of semiconductor material such as polysilicon, the raised extrinsic base layer 122 being electrically connected to the intrinsic base layer 112 by a link-up region 121. A low resistance layer such as a layer 123 of silicide and/or metal is disposed over the raised extrinsic base layer 122. Further, the raised extrinsic base layer 122 and link-up region 121 are self-aligned to the emitter 114. The link-up region 121 is formed in an annular opening 115 that resembles an upside-down "T" in appearance that connects the extrinsic base 128 to the intrinsic base 112. The ring-like opening 115 is formed around the emitter 114 in the extrinsic base layer 128. This arrangement provides for a link-up region 121 that is included in the raised extrinsic base to contact the intrinsic base in an undercut region that extends from a second opening, which is preferably annular in appearance. In the case of the embodiment shown in FIG. 3, the emitter dimension and the self-alignment of the extrinsic base 128 to the emitter 114 are determined independently. The process flow will be discussed in conjunction with FIGS. 4 through 23 below.

The raised extrinsic base of transistor 100 is provided as a stack 128 including the link-up region 121, polycrystalline semiconductor layer 122 and silicide layer 123. The stack 128 is formed at least partially over the intrinsic base 112. A layer 124 of polysilicon is also at least partially disposed over a shallow trench isolation region 126 to the side of layer 112. A layer of oxide 120 is at least partially disposed over the polysilicon layer 124 where it overlies the isolation regions 126. The collector contact is made to an active area 103 through a silicide layer 125 formed between shallow trench isolations 126.

The transistor 100 also includes dielectric spacers 130, 132 disposed on a sidewall of the raised extrinsic base 128 such that the emitter 114 is spaced from the raised extrinsic base by a width of the spacer. In the embodiment illustrated in FIG. 3, the dielectric spacer include an oxide spacer 132 contacting a sidewall of the raised entrinsic base 128 and a nitride spacer 130 overlying the oxide spacer 132. The nitride spacer 130 in this embodiment has a front face contacting a sidewall of the emitter 114 and a rear face opposite the front in contact with the oxide spacer 132. In addition, in a preferred embodiment the oxide spacer is shaped like an "L" such that the oxide spacer 132 also contacts a bottom surface of the nitride spacer 130.

A layer of oxide 136 separates an upper portion of emitter 114 from the layer of polysilicon 122. Spacer 158 is provided on exterior sidewalls of the upper portion of the emitter 114. In addition, vertical contact to each of the raised extrinsic base 128, emitter 114 and collector 116 from a overlying wiring level (not shown) are provided through metal or metal-silicide filled vias 140, 142 and 144 that are etched into an overlying deposited interlevel dielectric layer (ILD) 146 and one or more additional dielectric layers 148 and 150. Desirably, dielectric layers 148 and 150 consist essentially of a nitride such as silicon nitride, and ILD 146 consists essentially of a deposited oxide, for example a silicon dioxide such as a TEOS oxide or borophosphosilicate glass (BPSG).

There are many advantages in using the bipolar transistor as the one provided in the embodiment illustrated in FIG. 3. One advantage is that the link-up in the present invention is achieved without affecting final emitter dimension or the integrity of the junction between emitter and the intrinsic base. This is because the link-up layer is formed in an undercut region etched from an opening separate from the opening in which the emitter 114 is formed.

Other advantages of the present invention can be better understood after exploring methods of fabrication of at least one embodiment of the present invention. For example, there is no chemical mechanical polishing planarization used and selective epitaxial growth of the intrinsic base is not required. Furthermore, there is no excess silicon formed on top of the emitter cap layer that can affect performance or integrity. No oxidation is required either. Instead, oxide layers needed for the isolation and spacer between the emitter and the extrinsic base can be deposited using low thermal budgets. The above-mentioned advantages make the fabrication process less costly, while achieving better results in terms of performance and the integrity of the transistor.

Figure 4:
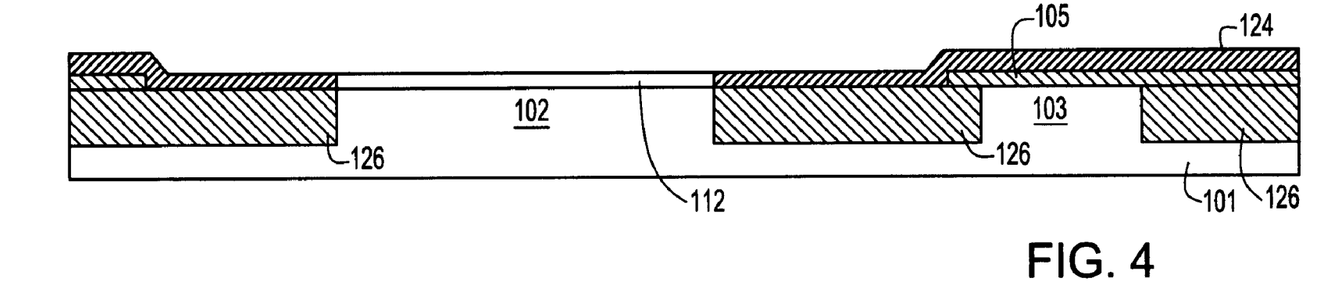
FIGS. 4 through 23 illustrate a method of fabricating a bipolar transistor according to embodiments of the invention.

A method of fabricating a transistor 100 according to an embodiment of the invention is illustrated in FIGS. 4 through 23. As depicted in FIG. 4, a single-crystal silicon substrate 101 is patterned to form a first active area 102 and a second active area 103, and shallow trench isolation 126 between the active areas 102 and 103. Desirably, the shallow trench isolation 126 are filled with a dense oxide, such as may be provided by a high density plasma (HDP) deposition. A layer 105 of dielectric material, preferably formed by depositing silicon dioxide, such as from a TEOS precursor, is patterned to expose first active area 102 but not second active area 103.

Also depicted in FIG. 4, a layer of a single-crystal semi-conductor silicon or alloy such as a layer of silicon germanium (SiGe) having a substantial percentage content of germanium is epitaxially grown onto the surface of the substrate in active area 102. Such SiGe layer desirably has a germanium content which is greater than 20%, while the silicon content makes up a complementary percentage. Layer 112 will eventually form at least a portion of the intrinsic base for the transistor 100. In one embodiment of the invention, an additional layer consisting essentially of silicon is epitaxially grown over the SiGe layer as another layer of the intrinsic base. Such SiGe layer and any such silicon layer, together make up the intrinsic base 112.

Figure 5:
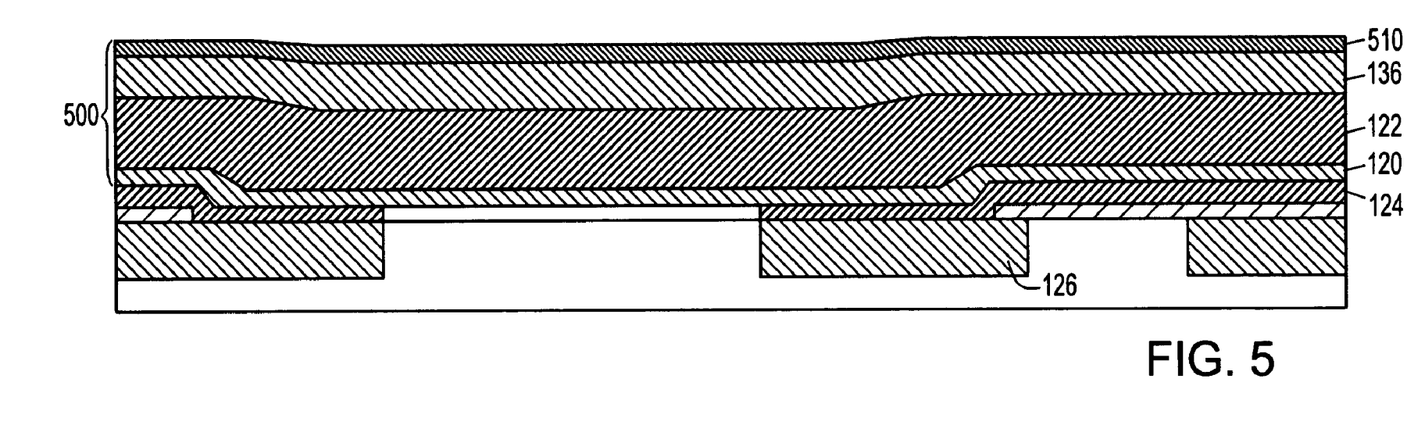

Thereafter, as shown in FIG. 5, a layered stack 500 is formed. The stack includes a first relatively thin oxide layer 120, over which a layer of polysilicon 122 and another layer of oxide 136 are provided by deposition. Layer 122 can also be a polycrystalline SiGe. The polysilicon layer 122 is preferably doped. An overlying layer of nitride 510 such as silicon nitride is disposed over the oxide layer 136 within stack 500.

Figure 6:
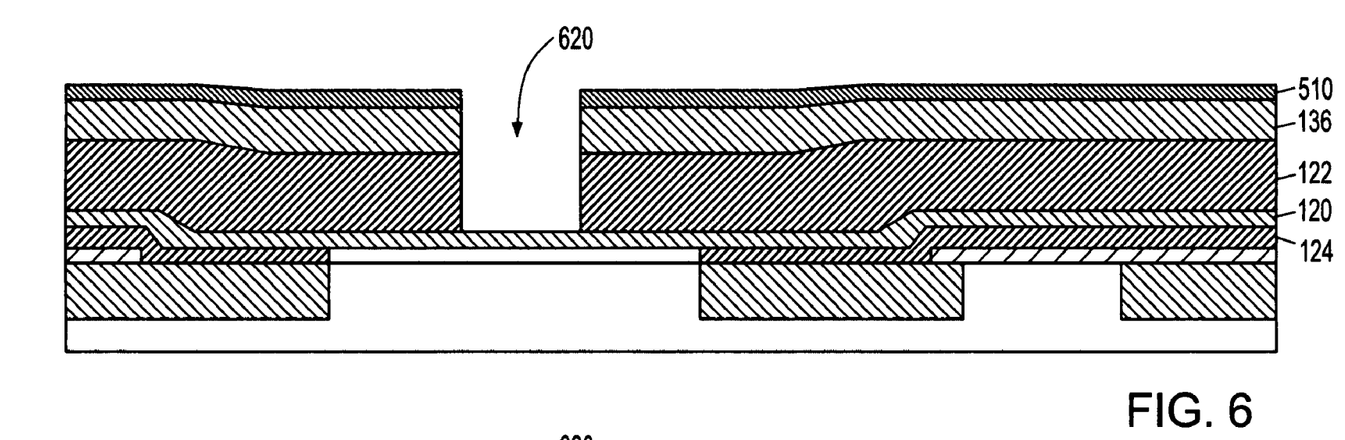

Thereafter, as shown in FIG. 6, the nitride layer 510, oxide layer 136, and polysilicon layer 122 of the stack are patterned, such as by lithography and RIE, to form an opening hereinafter referenced as 620.

Figure 7:
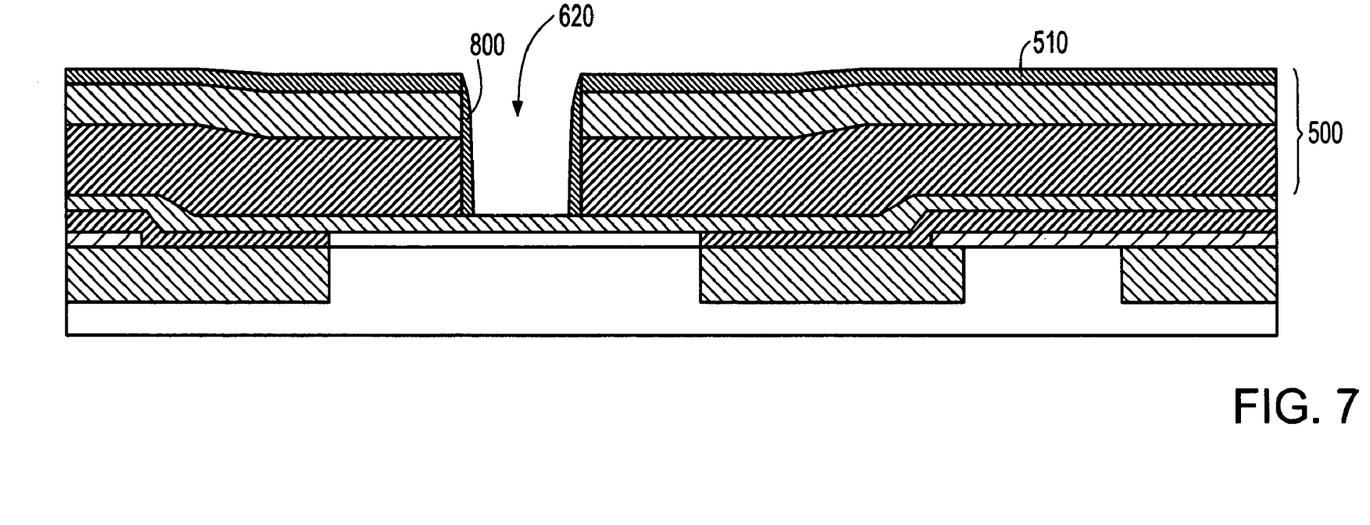

As shown in FIG. 7, a nitride spacer 800 is formed along the sidewalls of stack 500 in the opening 620. The spacer is formed by deposition of a conformal layer of nitride (not shown). The nitride is then etched directionally, as by RIE, to remove the nitride from all horizontal surfaces inside the opening 620 so that the spacer 800 only remains on the sidewalls of the stack 500 inside the opening 620.

Figure 8:
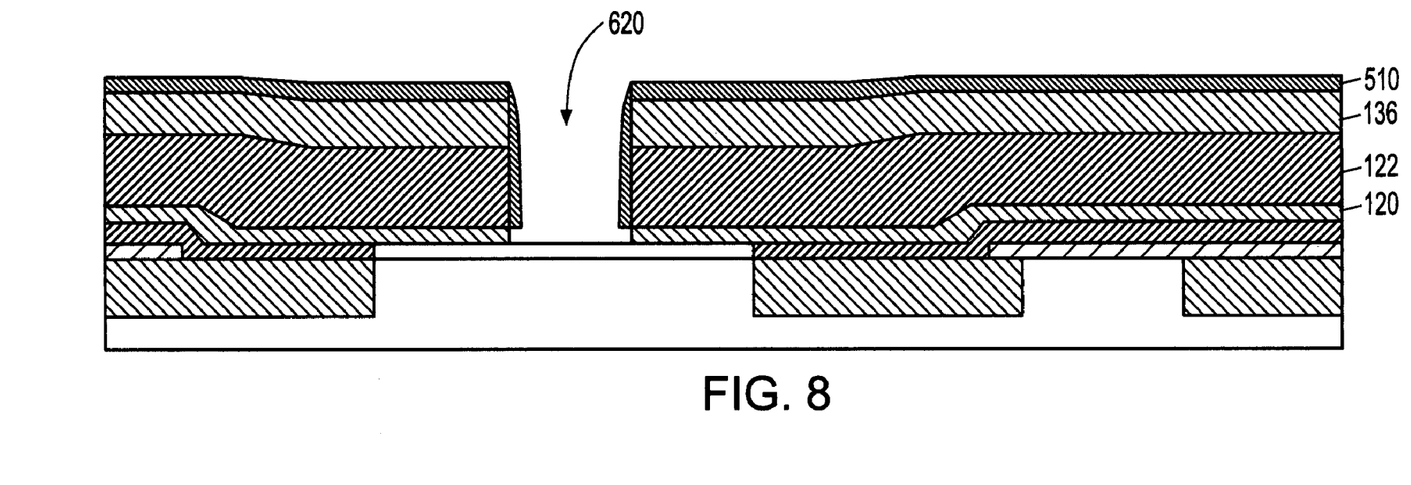
Figure 9:
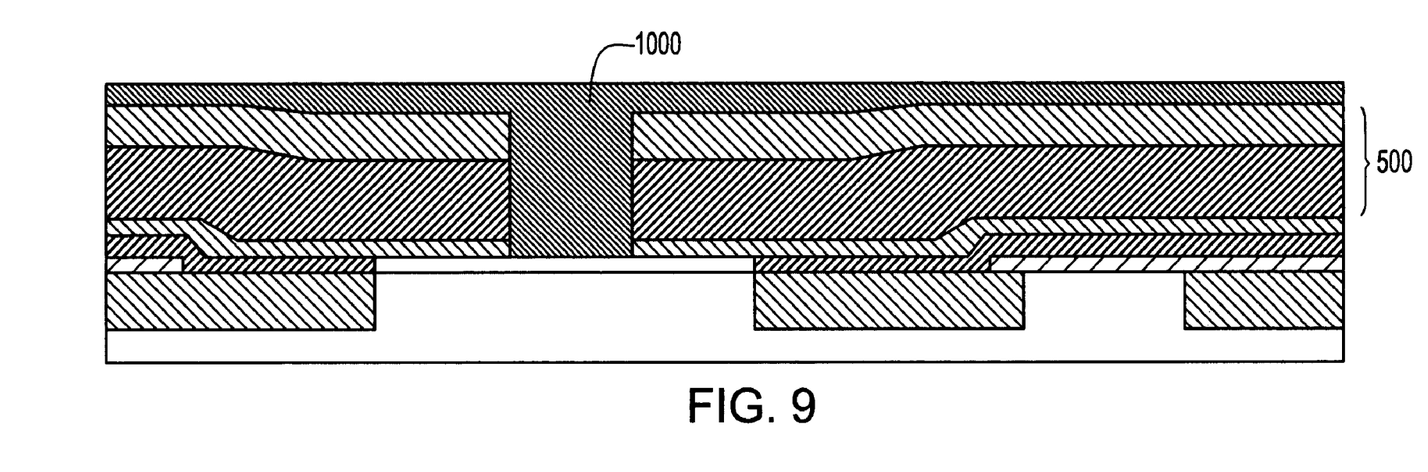

Next, as illustrated in FIG. 8, a wet etch is performed so that the oxide layer 120 is removed from inside the opening 620. In FIG. 9, a new layer of nitride 1000 is deposited on the stack 500, filling the opening previously referenced as 620 entirely and adding to the thickness of the nitride layer 510 already overlying the stack 500. The new combined nitride layers will hereinafter be simply referenced as nitride layer 1000.

Figure 10:
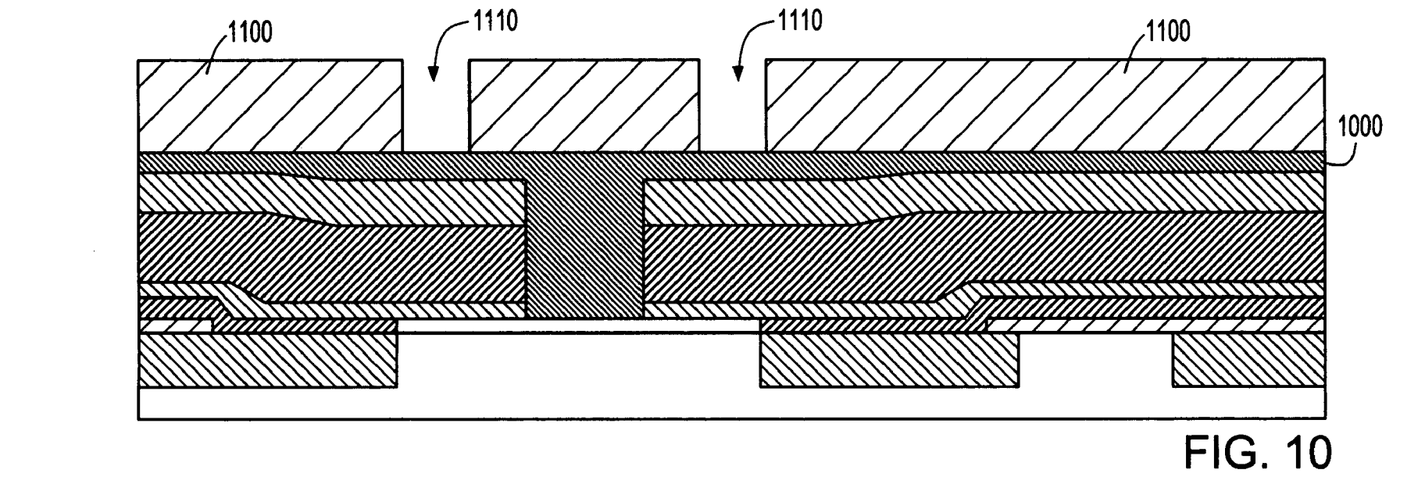

The next processing stage is illustrated in FIG. 10 where a layer of photoresist 1100 is deposited on the nitride layer 1000 and photolithographically patterned to define an annular opening 1110 in the photoresist layer 1100.

Figure 11:
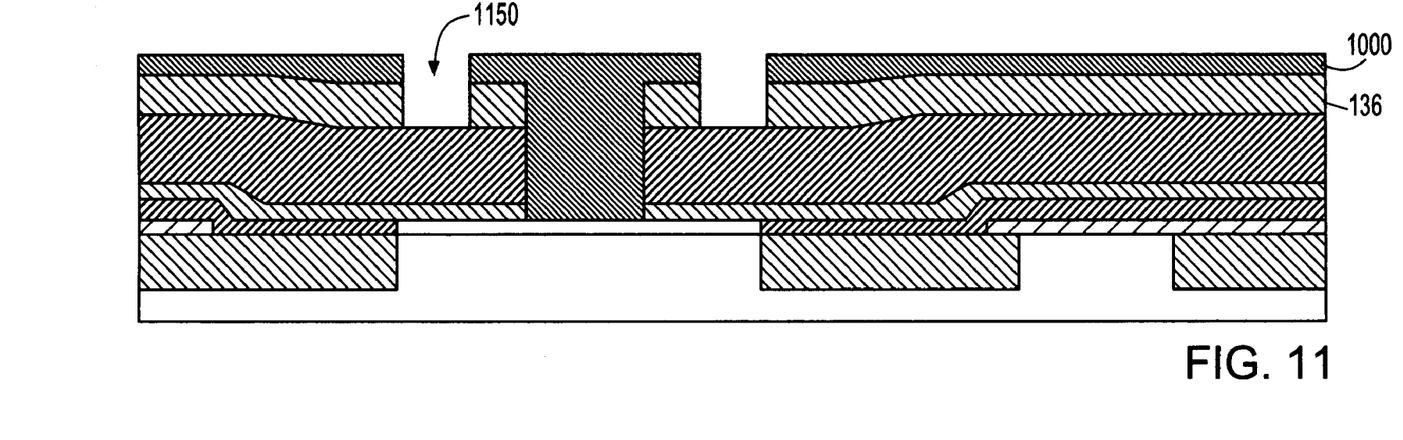

As illustrated in FIG. 11, the nitride layer 1000 is then patterned according to the opening 1110 in the photoresist, as by a reactive ion etch (RIE). Next, the oxide layer 136 is patterned according to the opening in the nitride layer. Thereafter, the photoresist 1100 is stripped. After this processing, an opening 1150 exists in the nitride and oxide layers.

Figure 12:
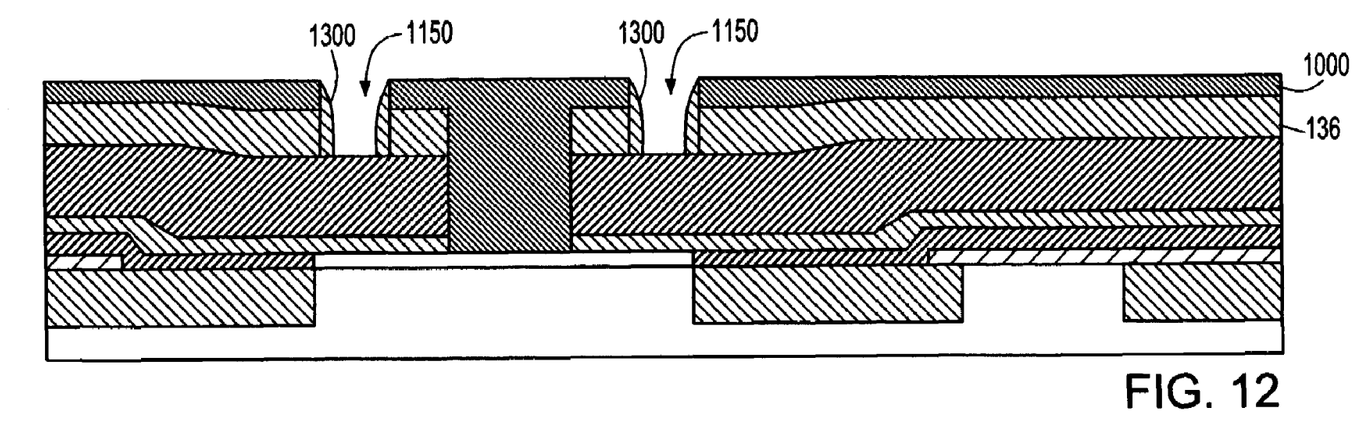

In FIG. 12, oxide spacer 1300 is formed along the sidewalls of the oxide layer 136 and nitride layer 1000 inside the opening 1150. Oxide spacer is formed by deposition of a conformal layer of oxide on the nitride layer 1000 and inside the opening 1150. The oxide layer is then removed from horizontal surfaces by etching, such as by RIE, so that only spacers 1300 remain along the vertical walls for the nitride-oxide layers 136 and 1000 inside the openings 1150.

Figure 13:
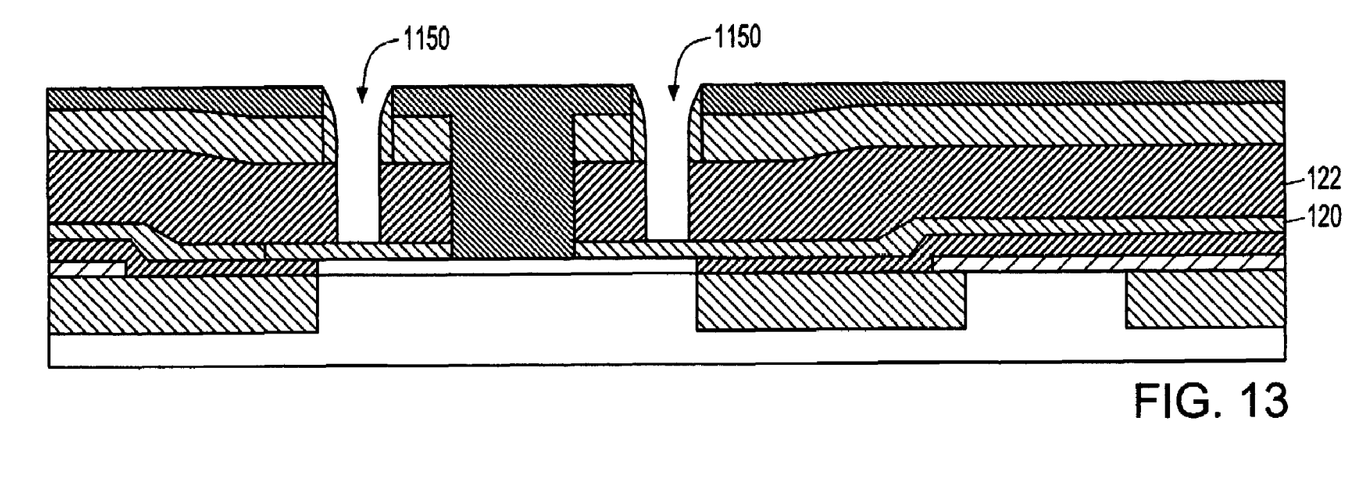
Figure 14:
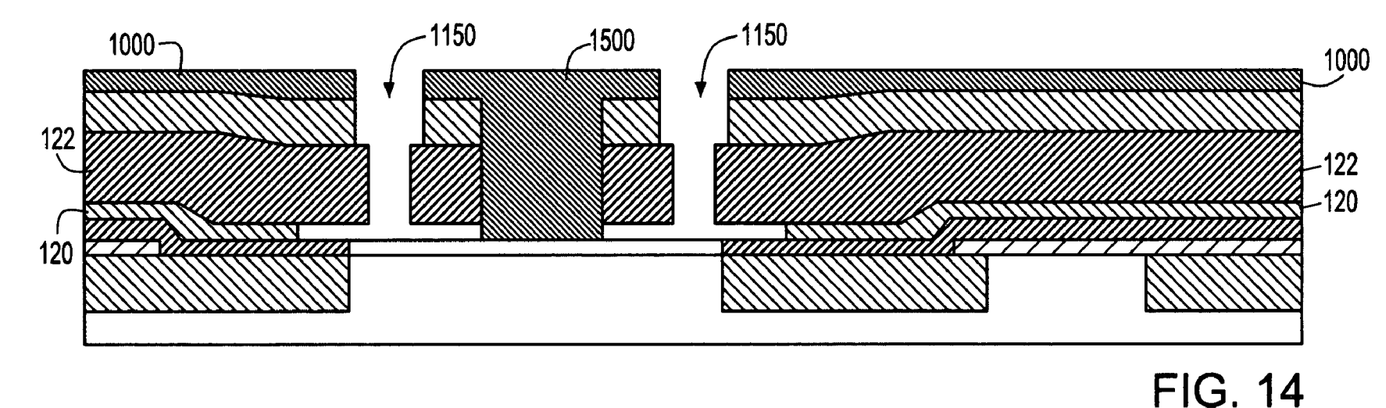

Next, as illustrated in FIG. 13, the polysilicon layer 122 is vertically etched, as by RIE, inside the opening 1150, stopping on the bottom oxide layer 120. This process is followed by an oxide wet etch, as illustrated in FIG. 14. The oxide wet etch is used to create an undercut extending to the first opening where the nitride layer 1000 has formed an emitter nitride sacrificial region, referred to here as a pedestal, hereinafter referenced as 1500. It should be noted that the oxide wet etch is provided inside the opening 1150, with the nitride layer 1000 acting as a hardmask.

Figure 15:
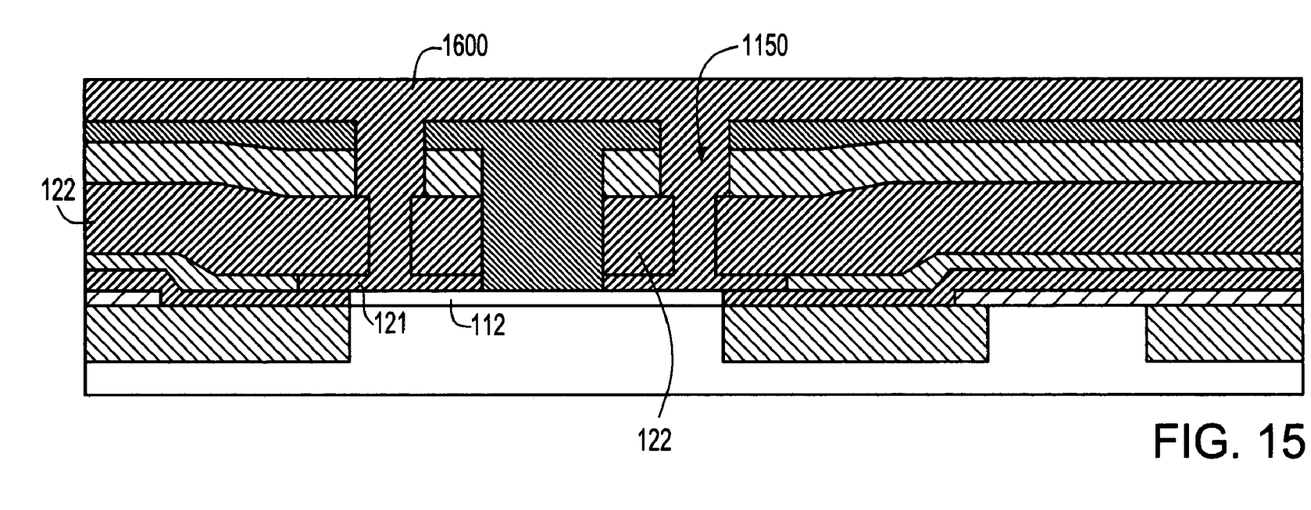

Thereafter, as illustrated in FIG. 15, a semiconductor deposition process is used to deposit and/or epitaxially grow semiconducting material in the region formerly occupied by the oxide layer 120 under the semiconducting layer 122, to form a link-up region 121 which links the semiconducting raised extrinsic base layer 122 to the intrinsic base layer 112. Such process is preferably performed by deposition of polysilicon and/or growth of silicon, in which case either a non-selective or a selective growth process is suitable. Alternatively, a deposition of polycrystalline silicon germanium and/or monocrystalline silicon germanium may be performed to provide the link-up region 121 for even lower resistance. As another alternative, a metal and/or a metal silicide may be deposited. As a result of this deposition, the opening 1150 is filled with semiconducting material, preferably consisting essentially of boron-doped polysilicon, or of metal and/or metal silicide, resulting in an overlying layer 1600 of polysilicon, as well.

Figure 16:
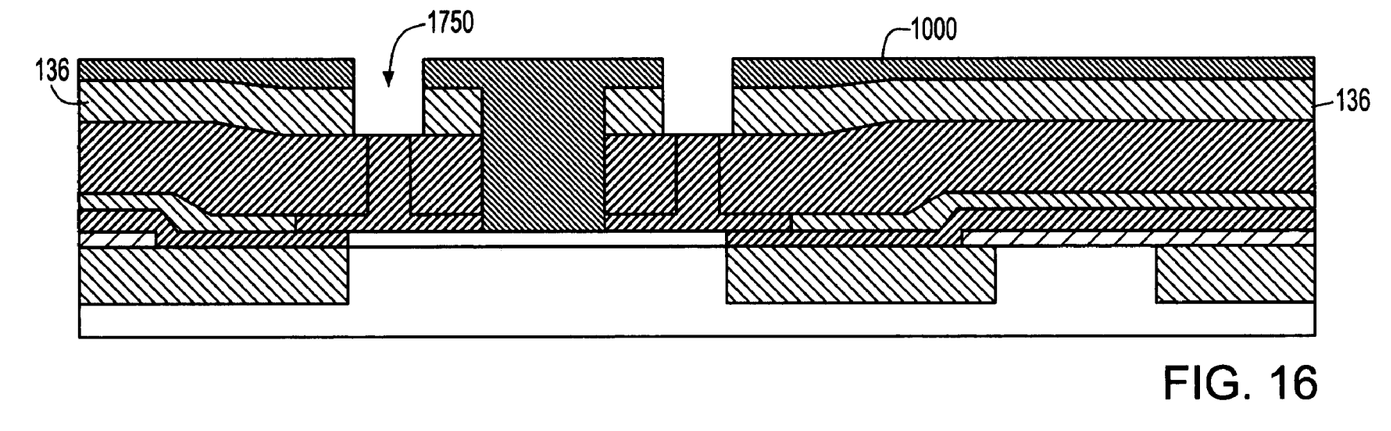

Next, as illustrated in FIG. 16, an etching of the polysilicon layer 1600 shown in FIG. 15 is performed, such as by RIE. This etching process removes the excess overlaying polysilicon layer so that the nitride layer 1000 is exposed. In addition, a new recess opening 1750 is formed. The opening 1750 is also annular and is formed by recess etching the polysilicon, stopping at a level just below the oxide layer 136.

Figure 17:
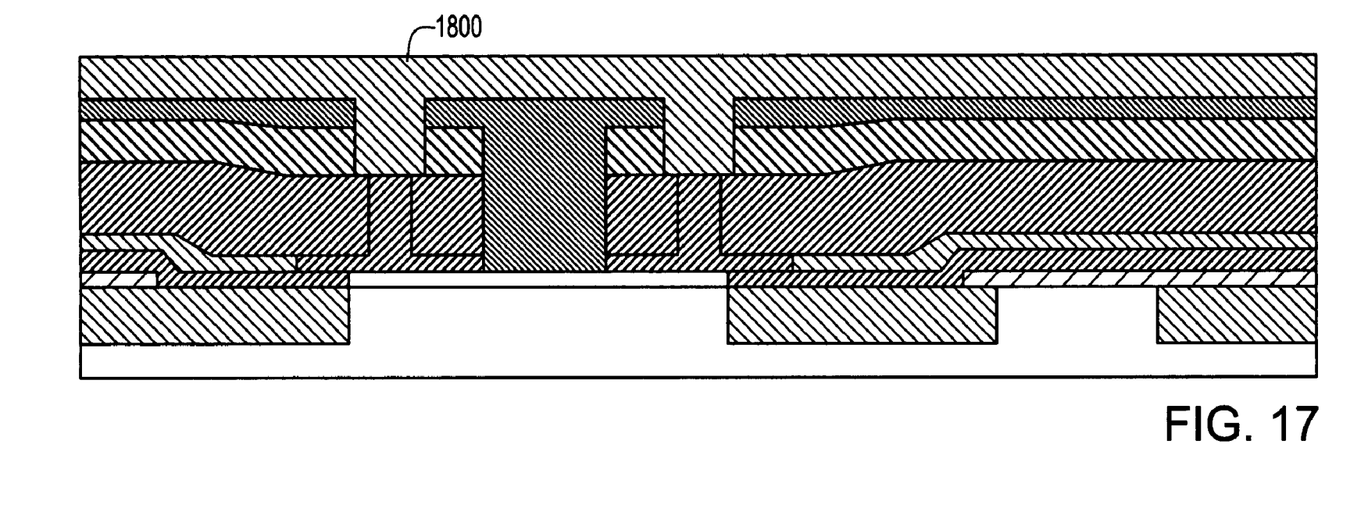
Figure 18:
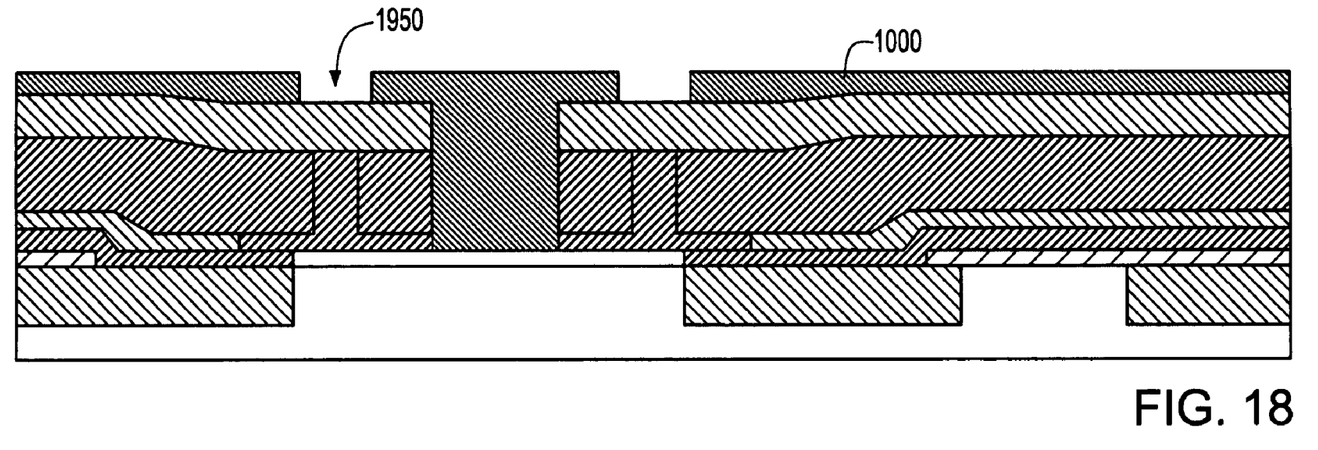

Thereafter, as illustrated in FIG. 17, a layer of oxide 1800 is deposited on the nitride layer 1000 to fill the recess opening. As illustrated in FIG. 18, RIE is performed to remove the excess oxide that overlies the nitride layer 1000. Etching process is also used to remove some of the oxide from the previously referenced recess opening 1750 to create a new opening 1950.

Figure 19:
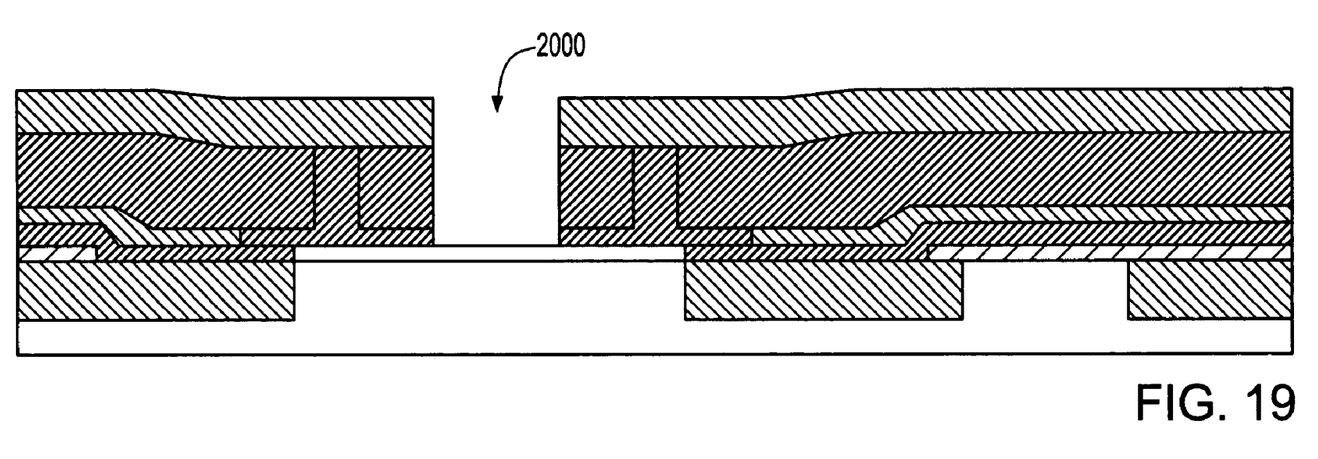

In FIG. 19, the nitride sacrificial pedestal (referenced as 1500 in FIG. 14) is removed to form opening 2000. The removal process can be easily accomplished using an etching technique. A variety of etching techniques can be used for such removal such as a nitride wet etch or even RIE.

Figures 20, 21:
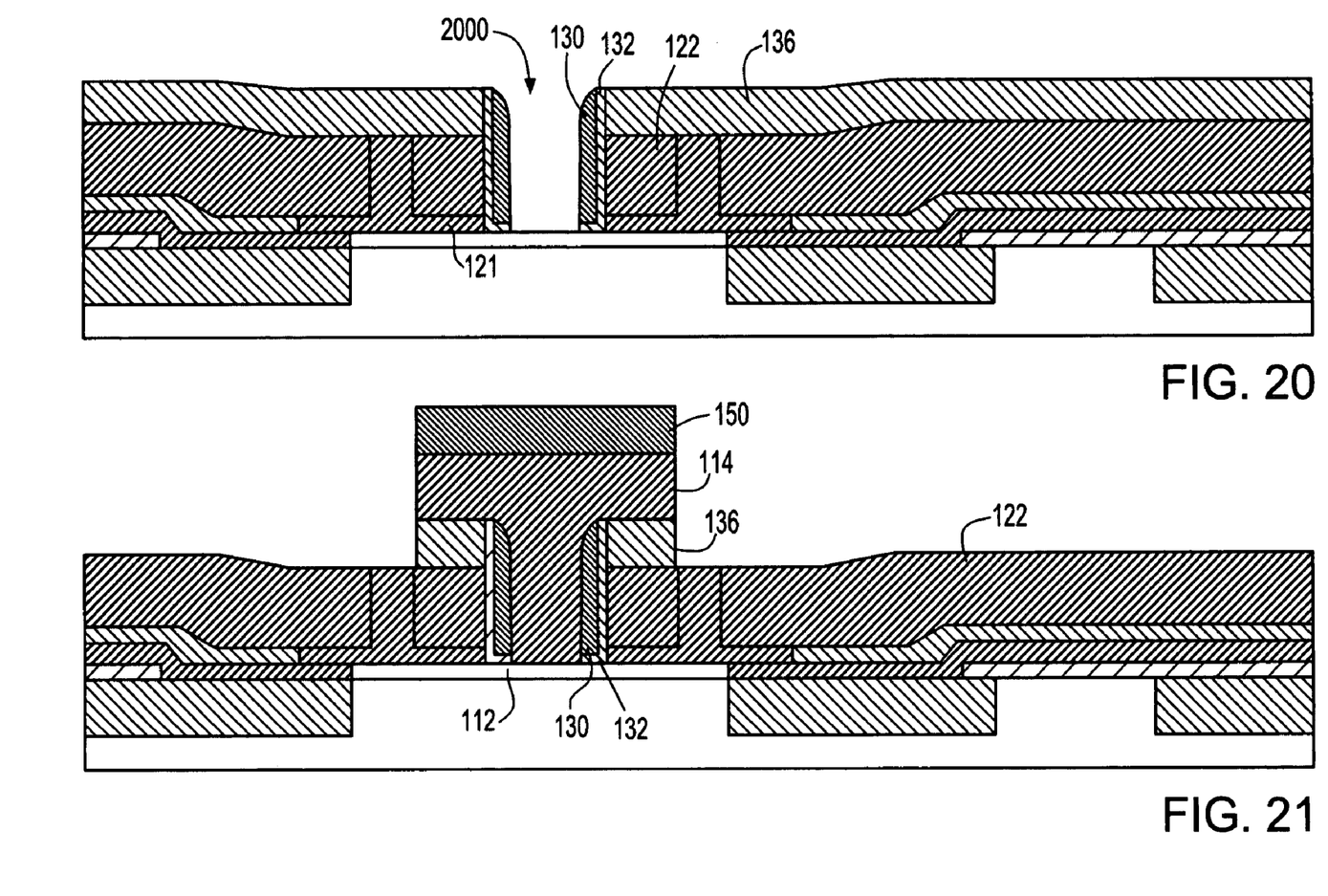

Thereafter, as depicted in FIG. 20, an oxide spacer 132, and then a nitride spacer 130 are formed, in order, on a sidewall of the oxide layer 136 and the polysilicon layer 122 and link-up region 121 within opening 2000. The spacers 132 and 130 are formed as follows. An oxide layer (not shown) is formed by conformal deposition in opening 2000, as from a TEOS precursor, after which a nitride spacer 130 is formed by conformally depositing a layer of silicon nitride and then vertically etching that layer, as by RIE, leaving behind vertical spacers 130. The oxide layer, where not covered by the nitride spacer 130, is wet stripped by an etch process selective to silicon, leaving behind oxide spacer 132.

Next, as illustrated in FIG. 21, a series of steps are performed to form the emitter 114 of the transistor. In these steps heavily doped polysilicon is deposited to contact the intrinsic base 112 and fill the opening between spacer 130 to form the emitter 114. Alternatively, a metal and/or a metal silicide is deposited to fill the emitter opening. A dielectric layer 150, preferably including silicon nitride, is deposited on the emitter polysilicon layer to serve as a hardmask in a subsequently performed step. Thereafter, a photoresist (not shown) is patterned to expose the dielectric layer 150 in areas except where it overlies the filled opening of the emitter 114. Next, the dielectric layer 150 is etched, as by RIE, using the patterned photoresist as a mask. The photoresist is then stripped, and the polysilicon layer of the emitter 114 is then patterned, as by RIE, selective to the silicon nitride material of the hardmask layer 150. Thereafter, the underlying oxide layer 136 is removed except where it underlies the emitter polysilicon, as by RIE or wet etch, selective to silicon, to expose the polysilicon layer 122.

Figure 22:
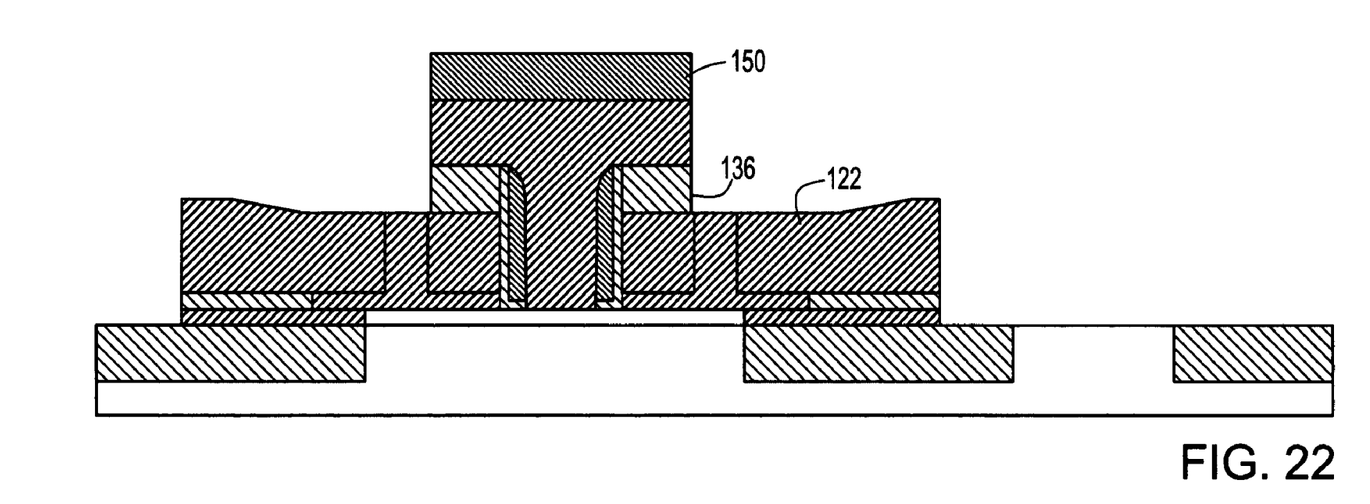

Thereafter, as illustrated in FIG. 22, a photoresist pattern (not shown) is used to RIE etch the extrinsic base stack in order to define the extrinsic base region. Polysilicon layer 122 is RIE etched and patterned to form the structure illustrated in FIG. 22.

Figure 23:
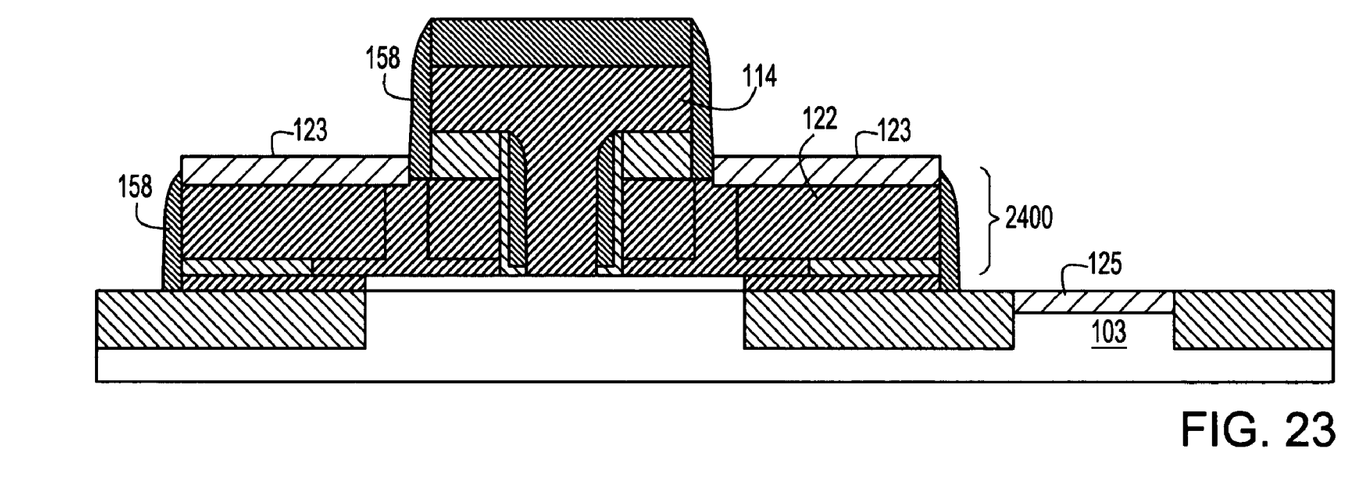

In the next processing stage, as illustrated in FIG. 23, nitride spacers 158 are formed on exposed vertical surfaces of the emitter 114 and the layered stack 2400. The nitride spacers 158 are formed by depositing a layer of nitride such as silicon nitride on the structure, followed by vertical etching, as by RIE.

In addition, as illustrated in FIG. 23, silicide layers 123 and 125 are desirably formed on exposed upwardly facing surfaces of polysilicon layer 118 and the single-crystal silicon collector reach through area 103. Silicide layers 123 and 125 are formed by depositing a metal that readily reacts with silicon under appropriate conditions to form a silicide, and thereafter applying those conditions, e.g., moderately high temperature. Thereafter, unreacted metal is removed, as by etching selective to the silicide, leaving the salicide in place.

Finally, referring again to FIG. 3, further dielectric layers 148, 146 are formed over the structure. Vertical contact vias 140, 142 and 144 are formed to contact the emitter, raised extrinsic base, and collector, respectively, to result in the structure of the transistor 100 as shown in FIG. 3.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A bipolar transistor, comprising:
    a collector region;
    an intrinsic base layer overlying said collector region, said intrinsic base layer including a single-crystal semiconductor;
    an emitter disposed within a first opening overlying said intrinsic base layer;
    a raised extrinsic base, including:
        a raised extrinsic base layer overlying said intrinsic base layer; and
        a link-up region electrically connecting said raised extrinsic base layer to said intrinsic base layer, said link-up region self-aligning said raised extrinsic base to said emitter, said link-up region disposed in a second opening oriented in a vertical direction substantially perpendicular to said intrinsic base layer and separate from said first opening and in an undercut region extending horizontally outward from said second opening below said raised extrinsic base layer in a first direction towards said emitter.

2. A bipolar transistor as claimed in claims 1, wherein said second opening surrounds said emitter and has annular shape, wherein said undercut region further extends horizontally outward from said second opening in a second direction away from said emitter.

3. A bipolar transistor, comprising:
  a collector region;
  an intrinsic base layer overlying said collector region, said intrinsic base layer including a single-crystal semiconductor;
  an emitter disposed within a first opening overlying said intrinsic base layer;
  a raised extrinsic base, including:
    a raised extrinsic base layer overlying said intrinsic base layer; and
    a link-up region electrically connecting said raised extrinsic base layer to said intrinsic base layer, said link-up region self-aligning said raised extrinsic base to said emitter, said link-up region disposed in a second opening separate from said first opening and in an undercut region extending from said second opening below said raised extrinsic base layer, wherein said raised extrinsic base layer includes an inner portion disposed adjacent to said emitter and an outer portion opposite said second opening from said inner portion, wherein said link-up region electrically connects said inner portion to said outer portion.

4. A bipolar transistor as claimed in claim 3, further comprising a dielectric spacer disposed on a sidewall of said inner portion of said raised extrinsic base layer of said link-up region, such that said inner portion and said link-up region are spaced from said emitter by a width of said spacer.

5. A bipolar transistor as claimed in claim 4, wherein said dielectric spacer includes an oxide spacer contacting a sidewall of said raised extrinsic base layer and a nitride spacer overlying said oxide spacer, said emitter contacting a sidewall of said oxide spacer.

6. A bipolar transistor as claimed in claim 1, wherein said link-up region includes at least one material selected from the group consisting of doped semiconductors, metals and metal silicides.

7. A bipolar transistor as claimed in claim 1 wherein said raised extrinsic base layer includes a layer of a polycrystalline semiconductor and a low resistance layer overlying said polycrystalline semiconductor layer, said low resistance layer including at least one material selected from metals and metal silicides.

8. A heterojunction bipolar transistor (HBT) having a structure as claimed in claim 1, wherein said single-crystal semiconductor includes a semiconductor alloy, such that said intrinsic base layer forms a heterojunction with at least said collector region.

9. An HBT as claimed in claim 8, wherein said semiconductor alloy consists essentially of silicon germanium.

\* \* \* \* \*

UNITED STATES PATENT AND TRADEMARK OFFICE
CERTIFICATE OF CORRECTION

PATENT NO. : 6,972,443 B2  Page 1 of 1
APPLICATION NO. : 10/709222
DATED : December 6, 2005
INVENTOR(S) : Marwan Khater It is certified that error appears in the above-identified patent and that said Letters Patent is hereby corrected as shown below:

Col. 1, Lines 4-5
please insert:
Notice of Government rights
--This invention was made with Government support under N66001-02-C-8014 awarded by DARPA. The Government has certain rights in this invention.--

Signed and Sealed this

Thirtieth Day of March, 2010

David J. Kappos
*Director of the United States Patent and Trademark Office*